July 2, 1957 L. A. HOROWITZ 2,798,158

TUNABLE HIGH FREQUENCY OSCILLATOR CIRCUIT

Filed May 27, 1953

INVENTOR.

LEOPOLD A. HOROWITZ

BY H. L. Newton

ATTORNEY

United States Patent Office 2,798,158

Patented July 2, 1957

2,798,158

TUNABLE HIGH FREQUENCY OSCILLATOR CIRCUIT

Leopold A. Horowitz, Haddonfield, N. J., assignor to Radio Corporation of America, a corporation of Delaware Application May 27, 1953, Serial No. 357,695

3 Claims. (Cl. 250—36)

Figure 1:
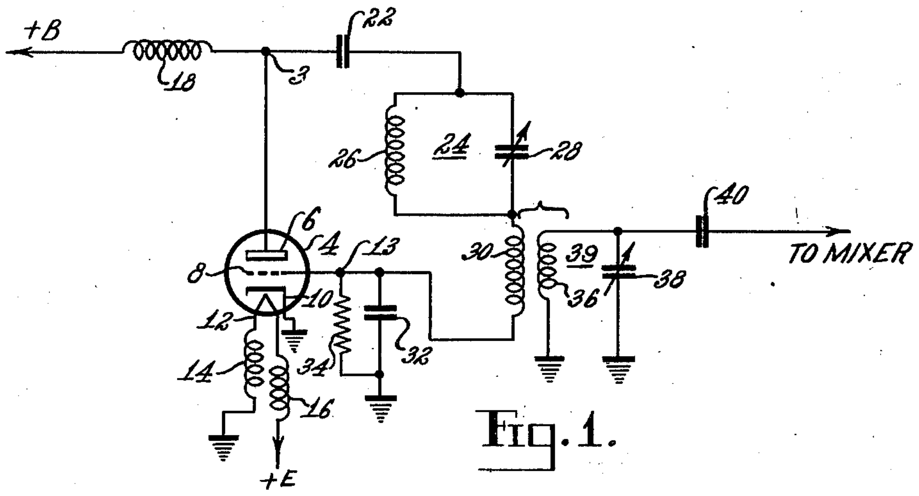

This invention relates to tunable high frequency oscillator circuits for signal receiving systems and the like, and in particular to oscillator circuits of the type referred to which are tunable over an extensive frequency range such as the ultra high frequency (U.-H.-F.) television band.

A U.-H.-F. band of frequencies has been recently allocated for the transmission of television signals, which fall in the frequency range of 470–890 megacycles (mc.). This band will accommodate television channels 14 to 83. In receiving signals in this U.-H.-F. range it is obvious that the local oscillator of a television receiver must be tunable over a substantially similar range of frequencies in order to provide a selected intermediate frequency signal.

As is well known and understood, in order to tune a receiver to different selected signals, both the local oscillator and the radio frequency input circuits of the receiver must be tunable, and a constant frequency difference corresponding to the selected intermediate frequency should be maintained between the frequency of the received signal and the frequency of the local oscillator signal. Thus far, oscillator tubes capable of oscillating at such high frequencies in tunable circuits have not been developed to any extent for commercial use in home-instrument type radio receiving equipment. The need for a system of the type referred to, using conventional electron discharge tubes has therefore become important, particularly in the new U.-H.-F. television receiver field.

To enable the average very high frequency (V.-H.-F.) home type television receiver to reproduce any of the transmitted signals, some type of frequency conversion system must be used to convert the U.-H.-F. signals to V.-H.-F. signals. One of the simplest forms of such a conversion system comprises a signal selective input circuit, a mixer circuit, and a local oscillator. By utilizing well known superheterodyne principles, the received signals and the local oscillator signals may be heterodyned in the mixer circuit to produce a selected intermediate frequency signal. This intermediate frequency signal may correspond to the frequency of a selected V.-H.-F. television channel. Thus by initially converting the U.-H.-F. signal to a V.-H.-F. signal the V.-H.-F. receiver may be adapted for U.-H.-F. reception.

In developing local oscillator circuits suitable for U.-H.-F. signal reception and using conventional oscillator tubes, selected harmonic frequency signals of the oscillator fundamental frequencies have been utilized. While oscillators of the type in which harmonic frequency signals are utilized are generally well known, most of the prior art devices are not tunable within the U.-H.-F. band of frequencies. In addition, due to the arrangement of the oscillator circuit elements relative to each other and to the tube interelectrodal capacitances, alternate electrical paths are provided for the harmonic frequency signals in some of the prior art circuits. It is for this reason that appreciable amounts of useful harmonic signal energy may be lost.

It is well known that for maximum efficiency of an oscillator circuit of the type referred to, all or substantially all of the harmonic signals generated should pass to an output or utilization circuit. It is desirable that these requirements for a U.-H.-F. oscillator be achieved using conventional tuning elements having practical impedance values, and it is accordingly an object of the present invention to provide an improved oscillator for use in a U.-H.-F. converter or receiver system which is tunable over the entire U.-H.-F. band of frequencies, or any like high frequency band.

A further object of the present invention is to provide an improved local oscillator for superheterodyne signal receiving systems and the like, which is tunable over a wide range of ultra-high frequencies by means of conventional tuning elements.

It is still another object of the present invention to provide an improved local oscillator circuit for signal reception, which is tunable to selected frequencies within the U.-H.-F. band of frequencies and which uses conventional electron-discharge tubes.

It is yet another object of the present invention to provide an improved local oscillator of the type in which harmonic frequency signals are utilized, and which exhibits maximum efficiency over its entire range of tunable frequencies.

These and further objects of the present invention are achieved by providing an improved oscillator circuit in which a parallel-resonant frequency-determining circuit is connected with the anode of an electron discharge tube. An inductor having a preselected impedance value is connected in series between the tank circuit and the control electrode of the tube; the combination of one of the branches of the parallel resonant circuit and the inductor providing a low impedance path for harmonic frequency signals. The harmonic frequency signal output is taken from the inductor. Such a system has proved to be highly effective and may be constructed at low cost for wide commercial application.

Figure 2:
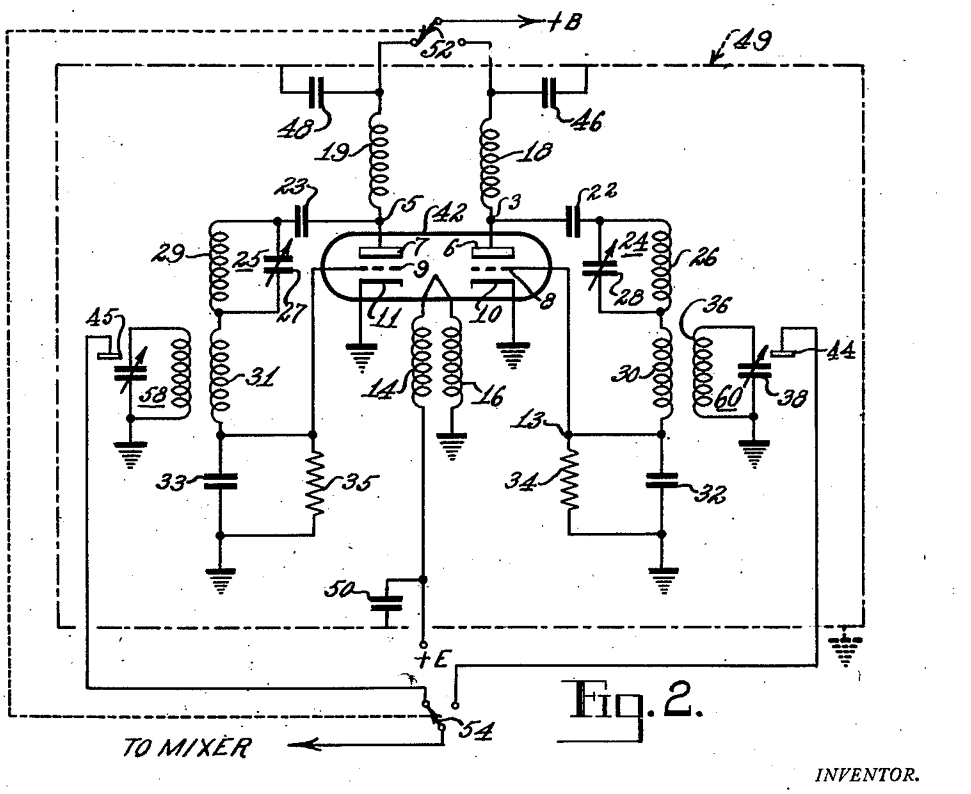

The novel features that are considered characteristic of this invention are set forth with particularity in the appended claims. The invention itself, however, both as to its organization and method of operation, as well as additional objects and advantages thereof, will best be understood from the following description when read in connection with the accompanying drawing, in which:

Figure 1 is a schematic circuit diagram of a tunable oscillator circuit embodying the invention, and Figure 2 is a schematic circuit diagram of a modification of the oscillator circuit of Figure 1, in accordance with the invention.

Referring now to the drawing wherein like parts are indicated by like numerals in both figures, and particularly to Figure 1, an electron discharge device 4 having an anode 6, a cathode 10, a control electrode or grid 8, and a filament 12 is provided as the oscillator device. The anode 6 is connected through an anode circuit 3 including a radio frequency choke coil 18 to a source of anode energization potential indicated at +B, the coil 18 preventing unwanted alternating currents from entering the anode power supply. The cathode heater 12 is connected through a radio frequency choke coil 16 to a source of heater voltage indicated at +E. The other end of the heater 12 is connected through a similar choke coil 14 to chassis or ground for the system, which is also the other side of the heater voltage source. The cathode is connected to the common ground by a direct connection as shown.

The electron tube 4 is self biased. To this end a biasing resistor 34 is connected in the control electrode or grid circuit 13 in series between the control electrode 8 and ground. In shunt with the resistor 34 is a grid capacitor 32 which may have a negative temperature coefficient of a suitable value for temperature compensation purposes.

The anode circuit 3 is connected through a blocking capacitor 22 to one end of the oscillator tuning or tank circuit 24. One branch of this circuit 24 contains the tuning inductor 26 and the other branch contains the shunt variable capacitor 28. The fundamental operating frequency of the oscillator is variable by means of the capacitor 28.

In accordance with the present invention, an inductor 30 is connected in series between the tank circuit 24 and the control electrode or grid 8 of the tube. By properly choosing the values of the inductor 26, the capacitor 28 and the inductor 30, currents at harmonics of the fundamental frequency flow through the inductor 30.

It has been found, for example, that by making the inductance of the inductor 26 appreciably greater than the inductance of the inductor 30, the series combination of capacitor 28 and inductor 30 presents a low impedance path to harmonic frequency currents. Since the oscillator efficiency in delivering harmonics is not constant over the entire tunable range, the capacitor 28 and the inductor 30 can be so chosen that they are series resonant at the frequency of low efficiency, thus improving the overall performance of the circuit. The operation is such that these harmonic frequency currents readily flow through the circuit including the inductor 30, while the currents representative of the fundamental frequency flowing through the inductor 30 will be small and will develop a negligible voltage drop across this inductor. Since the inductance of inductor 30 is chosen to be very much smaller than the inductance of inductor 26, the inductor 30 also has negligible effect on the fundamental frequency of the oscillator. It has also been found that by using this arrangement which provides a single low impedance path for harmonic frequency signals, substantially all of the harmonic frequency signal energy may be utilized.

For impedance matching purposes the inductor 30 is coupled with an inductor 36 of a tunable selective output circuit 39 provided with a shunt variable tuning capacitor 38 for the inductor 36. The output circuit 39 is coupled through an output coupling capacitor 40 to a mixer stage as indicated or any other load circuit as desired. By varying the capacitor 38, the selective output circuit 39 may be tuned to the desired harmonic frequency. Thus the desired harmonic frequency signals may be transferred to the mixer stage. For most purposes in commercial television receivers the second or third harmonic frequency signals are utilized.

It will be recognized that the oscillator circuit illustrated is of the so-called ultra-audion type with the interelectrodal capacitances of the tube providing the necessary feedback network. In operation the fundamental operating frequency for effecting response to any desired signal is determined by adjusting the capacitor 28. The circuit then oscillates at a frequency determined primarily by the values of the inductor 26 and the capacitor 28 in the tank circuit 24. At the same time harmonic frequency currents flow through the inductor 30, the capacitor 32 and back to the cathode 10. By adjusting the value of capacitor 38 in the output circuit 39, signals representative of the desired harmonic frequency are passed to the mixer stage.

The circuit illustrated in Figure 2 shows an application of the improved oscillator embodying the present invention in a system of the general type described in a copending application by W. Y. Pan and D. J. Carlson, Serial No. 316,528, filed October 28, 1952, patent No. 2,753,456 dated July 3, 1956, and assigned to the same assignee. In this embodiment two substantially identical oscillator circuits are utilized which may be tuned to two different selected fundamental frequencies corresponding to two desired signal channels to be received. By selectively energizing the anodes of each section with a source of energization potential, the circuit may be used to provide harmonic frequency signals of one of the other of two selected fundamental frequencies for two channel signal selection in a receiver.

As shown in Figure 2, an oscillator tube 42 which may be of any suitable type such as a dual triode 6BQ7A, comprises two oscillator sections which are each substantially identical with the signal oscillator circuit illustrated in Figure 1. Thus the right hand section may contain an anode 6, a control grid or electrode 8, and a cathode 10 and the left hand section an anode 7, a control electrode 9, and a cathode 11. It should be understood that individual tubes may be used in place of the single tube illustrated, the latter being presently preferred.

Each section of the oscillator tube is selectively energized through switch means 52, comprising a simple two point switch in the present example, from a source of anode potential indicated by the positive lead +B. The right hand section as viewed in the drawing receives its energization or anode current through an inductor or choke coil 18 serially connected between the switch 52 and the anode 6. In a like manner the left hand section as viewed in the drawing receives anode current through an inductor or choke coil 49 which is in series between the switch 52 and the anode 7. Two by-pass capacitors 46 and 48 are connected between the anode leads on the switch side of the choke coils and chassis ground indicated by the dotted shield enclosure 49. These provide a by-pass to ground for unwanted radio frequency signals that may leak past the choke coils which serve to isolate the anodes from the power supply at operating frequencies.

Each section of the oscillator tube is connected with a tank circuit 24 and 25. These tank circuits may each be substantially identical to the single tank circuit of the oscillator illustrated in Figure 1, and comprise a variable capacitor 27—28 and an inductor 26—29 connected in parallel branches and coupled to the oscillator anode circuits 3 and 5 through capacitors 22 and 23 respectively. By varying the capacitance of the variable capacitors 27 and 28 in each tank circuit 24 and 25 respectively, the fundamental operating frequency of each oscillator section may be varied. As in the preceding embodiment, each section of the oscillator has a low impedance output path for harmonic frequency signals. This is provided by connecting the additional series inductors 30 and 31 between the tank circuits 24 and 25 and the respective control electrodes or grids 8 and 9. Grid bias voltages for the oscillator sections are provided by biasing resistors 34 and 35 respectively, which are shunted by grid capacitors 32 and 33. Although the values of these circuit elements may be different for different applications, it is preferred that they be identical for each section of the oscillator in a commercial two channel signal selector.

The cathodes 10 and 11 are heated by a single heater element 12. One end of the heater element is connected to system ground through a radio-frequency choke coil 16. The other end of the heater element is connected to a source of heater voltage indicated at +E through a choke coil 14. A by-pass capacitor 50 to ground is provided between the coil 14 and the source of heater voltage +E.

Each section of the oscillator has a parallel resonant output circuit 58 and 60 which are inductively coupled to the series inductors 31 and 30 respectively. Thus the resonant output circuits may be tuned to any selected harmonic frequency signal. The output signal is taken from the output circuit 60 through a small coupling capacitor plate 44 which has a low impedance value at high frequencies and for this purpose is closely associated or spaced with respect to the ungrounded side of the tuning capacitor 38. A similar coupling capacitor plate 45 is provided for the other output tuning capacitor 45 of the oscillator.

To connect the desired conducting output circuit to some form of heterodyne mixer, or other utilization means, a two-point switch 54 is provided which is preferably gang connected to the switch 52, which as previously explained selectively connects the +B voltage in circuit with the desired anode. The switch section 54 then operates, as shown, to connect the coupling capacitor plate 44 or 45 of the energized oscillator section with an output lead 55 leading to the external utilization means. The selected oscillator section is then connected through the tuned output circuit to the mixer input lead. It should be understood that the switching means may take any of a number of well known forms to accomplish the result achieved in the arrangement illustrated, that is, to select either of two available harmonic signals for external utilization such as for signal selection in a receiver.

The circuit illustrated in Figure 2 operates as follows: The individual triode sections of the tube 42 are energized selectively by a source of direct current voltage (+B) through the switch member 52 which connects the (+B) voltage in circuit with the desired oscillator section. The resonant or fundamental frequency at which the selected section oscillates may continuously be varied by means of the variable capacitor in the tank circuit. Thus the fundamental or resonant frequency of oscillator section may be considerably varied over an extensive range of frequencies. Each of the tank circuits for the individual oscillator sections may be pre-set at a predetermined fixed frequency, thus providing a system which will provide a signal output at either of two preselected frequencies.

As in the case of Figure 1, the harmonic frequency signal output for each of the sections is taken, in accordance with the invention, from the inductors 30 and 31 for the right and left hand sections respectively. By properly choosing the values of the inductors 30 and 31 and connecting them in series with the tank circuits 24 and 25 respectively, harmonic signals of sufficient amplitude will appear across one of the inductors, depending on which section is conducting. Fundamental frequency signals will develop but a negligible voltage drop across the inductors 30 and 31 and will be further filtered by the tunable output circuits 60 and 58 respectively. By virtue of the single harmonic frequency signal path, substantially all of the harmonic energy is utilized.

While it will be understood that the circuit specifications may vary according to the design for any particular application, the following circuit specifications are included by way of example only for an oscillator for U.-H.-F. signal reception:

| | |
|---|---|
| Inductors 14, 16 and 18 | 1 microhenry each. |
| Capacitors 22 and 32 | 27 and 2 micro-microfarads respectively. |
| Inductors 26, 30 and 36 | .11, .01 and .025 microhenry respectively. |
| Resistor 34 | 3900 ohms. |

It has been found that tuning over substantially the entire U.-H.-F. range may be accomplished by making the capacitors 28 and 38 variable between 1 and 10 micro-microfarads and 1 and 8 micro-microfarads respectively when using circuit components having the above values. Thus it is apparent that the circuit utilizes circuit elements having standard impedance values. When using the circuit illustrated in Figure 2, the circuit elements for each section may be made substantially identical with the elements used in Figure 1 and given above by way of example.

An improved oscillator circuit suitable for use as the local oscillator for signal receiver and converter systems operative within the U.-H.-F. band of frequencies may be made in accordance with the invention, with conventional type commercial electron-discharge tubes as well as conventional or readily available circuit elements and by virtue of the novel circuit arrangement is tunable over the required relatively wide range of ultra-high frequencies. Furthermore the improved circuit is easily constructed and adjusted in manufacture and a maximum signal energy output is obtained without adjustment in the field.

What is claimed is:

1. An oscillator circuit for operating over a range of the radio frequency spectrum comprising at least one electron discharge device having an anode, a cathode, and a control electrode, a frequency determining tank circuit tunable to provide a predetermined fundamental frequency signal and comprising two parallel branches one of said branches including a variable tuning capacitor and the other of said branches including a tuning inductor, means coupling said tank circuit between said anode and said control electrode, a second tuning inductor having a small inductance value relative to said tuning inductor connected in series with said tank circuit in the connection between said tank and said control electrode, the effective capacitance of said tank circuit and said second tuning inductor providing a low impedance path to harmonic frequency signals of said fundamental frequency signal between said anode and control electrode and tuned to resonance at a frequency of low harmonic efficiency of said oscillator circuit, and a frequency selective output circuit coupled to said second tuning inductor and tunable to pass certain of said harmonic frequency signals.

2. An oscillator circuit in accordance with claim 1 wherein said frequency selective output circuit is inductively coupled to said second tuning inductor and is tunable to pass second harmonic frequency signals of said fundamental frequency signal.

3. An oscillator circuit in accordance with claim 1, wherein said frequency selective output circuit is inductively coupled to said second tuning inductor and is tunable to pass third harmonic frequency signals of said fundamental frequency signals.

References Cited in the file of this patent

UNITED STATES PATENTS

| | | |
|---|---|---|
| 1,678,199 | Rettenmeyer | July 24, 1928 |
| 1,682,703 | Little | Aug. 28, 1928 |
| 1,719,521 | Schaffer | July 2, 1929 |
| 1,930,924 | Curtis | Oct. 17, 1933 |
| 1,982,916 | Kummerer | Dec. 4, 1934 |
| 2,206,388 | Buschbeck | July 2, 1940 |
| 2,664,510 | Russo | Dec. 29, 1953 |

FOREIGN PATENTS

| | | |
|---|---|---|
| 870,582 | Germany | Mar. 16, 1953 |